United States Patent [19]

Devgan

[11] Patent Number: 6,029,117
[45] Date of Patent: Feb. 22, 2000

[54] COUPLED NOISE ESTIMATION METHOD FOR ON-CHIP INTERCONNECTS

[75] Inventor: Anirudh Devgan, Austin, Tex.

[73] Assignee: International Business Machines Corporation, Armonk, N.Y.

[21] Appl. No.: 08/963,278

[22] Filed: Nov. 3, 1997

[51] Int. Cl.[7] .................................................. G06F 17/50
[52] U.S. Cl. ...................................... 702/58; 395/500.05
[58] Field of Search .................. 702/58, 59; 395/500.05, 395/500.06

[56] References Cited

U.S. PATENT DOCUMENTS

| | | | |
|---|---|---|---|
| 5,446,674 | 8/1995 | Ikeda et al. ............................. | 364/489 |
| 5,535,133 | 7/1996 | Petschauer et al. .................... | 364/489 |
| 5,555,506 | 9/1996 | Petschauer et al. .................... | 364/491 |
| 5,596,506 | 1/1997 | Petschauer et al. .................... | 364/491 |

OTHER PUBLICATIONS

Stanley Wolf, Guide to Electronic Measurements and Laboratory Practice, Prentice Hall, Inc., p. 67, Unknown month 1983.

W. C. Elmore, "The Transient Response of Damped Linear Networks with Particular Regard to Wideband Amplifiers", Journal of Applied Physics, vol. 19, Jan. 1948, pp. 55–63.

Paul Penfield et al., "Signal Delay in RC Tree Networks", 18th Design Automation Conference, pp. 421–425.

P. Feldmann et al., "Reduced–Order Modeling of Large Linear Subcircuits Via a Block Lanczos Algorithm", 32nd Design Automation Conference, pp. 474–479.

Kenneth Shepard et al., "Noise in Deer Submicron Digital Design", IEEE, 1996, pp. 524–531.

Lawrence Pillage et al., "Asymptotic Waveform Evaluation For Timing Analysis", IEEE Transactions on Computer–Aided Design, vol. 9, No. 4, Apr. 1990, pp. 352–366.

Rohini Gupta et al., "The Elmore Delay as a Bound for RC Trees With Generalized Input Signals", IEEE Transactions on Computer–Aided Design of Integrated Circuits and Systems, vol. 16, No. 1, Jan. 1997, pp. 95–104.

*Primary Examiner*—Marc S. Hoff
*Assistant Examiner*—Linh Nguyen
*Attorney, Agent, or Firm*—Casimer K. Salys; Andrew J. Dillon

[57] ABSTRACT

An efficient method for identifying potential noise failures in an integrated circuit design by predicting peak noise within a victim circuit of an integrated circuit. Initially, a victim circuit within an integrated circuit is located. An aggressor circuit within the integrated circuit is located which has a physical relationship with the victim circuit, normally proximity. The slope of a signal within the aggressor circuit is analyzed and the coupling currents induced in the victim circuit by the aggressor circuit are computed. The input slope of the aggressor circuit and the physical relationship between the victim circuit and the aggressor circuit are utilized to determine a peak current induced into the victim circuit utilizing modelled coupling capacitance. The peak current and the equivalent impedance of the victim circuit can be utilized to determine peak noise. Noise failures on integrated circuits can be avoided by detecting peak noise which is above acceptable levels.

20 Claims, 6 Drawing Sheets

COUPLED NOISE ESTIMATION METHOD FOR ON-CHIP INTERCONNECTS

BACKGROUND OF THE INVENTION

1. Technical Field

The present invention relates in general to a system and method for efficiently and accurately measuring the noise susceptibility of an integrated circuit design, and in particular to a system and method which can analyze multiple circuit topologies for potential noise failure problems. Still more particularly, the present invention relates to an integrated circuit noise measuring and noise analysis system for determining the maximum noise which might be induced into a susceptible circuit.

2. Description of the Related Art

Avoiding problems created by noise through noise analysis is a critical step in sub-micron integrated circuit design. Ever increasing requirements for integrated circuit performance have led to widespread utilization of dynamic logic circuit families and derivatives of dynamic logic families in integrated circuits. Dynamic logic families are aggressive circuit families, which trade noise margin for timing performance. Therefore, dynamic logic families are more susceptible to noise failure than conventional static logic. There is an ever increasing need for noise analysis methods and systems to analyze high speed integrated circuits.

Currently three basic methods: circuit simulation; timing simulation; and, model order reduction are prevalent in noise analysis. However, these techniques are inefficient for analyzing the massive amount of interconnect data which are present in state-of-the-art integrated circuits. Efficient techniques for accurate estimation of coupled noise in on-chip interconnects are presently a topic of intense investigation.

Timing analysis and power analysis have always been critical in the integrated circuit design process. With increasing operating frequencies, noise analysis and interference prevention are becoming more important in the integrated circuit design process. In many cases, interference prevention is more important than timing and power analysis. Advances in process technology have allowed a substantial reduction in the minimum distance between adjacent wires in an integrated circuit. Closer proximity of wires in an integrated circuit increases the coupling capacitance between a wire or circuit device and adjacent wires or devices.

Integrated circuit design constraints dictate that the distance between two wires in an integrated circuit can be reduced more than the height of the wire. Thus, the height of a wire on an integrated circuit is typically greater than the width of the wire. The aspect ratio of each wire and corresponding parallel surface area between two wires causes an increase in the ratio of coupling capacitance to ground plane capacitance.

For present day integrated circuits, the ratio of coupling capacitance to ground plane capacitance can be as high as thirty five percent. As a result of the increase in the coupling capacitance, a transient voltage or current on a wire, a node, or a net can adversely affect neighboring signals. If a circuit or net is quiet and that circuit's neighbor is active, capacitive coupling can induce a noise pulse in the quiet circuit. This coupling phenomena can have a detrimental effect on circuit response. For example, a coupled noise pulse can erroneously switch the state of a transistor which is required to be in a different state. Undesired switching of a single transistor can "lock up" an entire computer system rendering the computer system unresponsive to all input.

Over the last several years, dynamic logic circuit families and their derivatives have gained wide-spread acceptance. Dynamic circuits utilize a clock signal, or clock-like signal, to pre-charge an output driver. The advantage of dynamic logic is that the capacitive load of the output driver is substantially reduced as compared to prior topologies. Therefore, the core logic stage which drives the output stage can operate at faster speeds and the chip can provide reliable data to other parts of the computer system at higher clock speeds.

Complementary metal oxide semiconductor (CMOS) output driver structures utilize P-type transistors to pull logic signals up and N-type transistors to pull logic signals down. Hence, the term Complementary-MOS. Dynamic logic circuits utilizes only a single N-MOS pull down transistor for an output driver. In dynamic logic families the output stage loads the core logic with only the capacitance of a single N-MOS transistor. In prior CMOS circuits the input capacitance of an output stage is comprised of both a N-MOS transistor and a P-MOS transistor. Consequently, CMOS core logic is loaded with over twice the capacitance of the core logic of dynamic logic circuits. The switching voltage of a transistor in a dynamic logic gate is the threshold voltage of a single N-MOS transistor. In conventional CMOS circuits the switching voltage is half of the supply voltage. Today's manufacturing techniques allow the threshold voltage of a transistor to be close to zero.

In summary, CMOS circuits are slower because they require a higher voltage to switch logic states and signal rise times are slowed by the higher input capacitance. Hence, dynamic logic circuits trade noise margin, or susceptibility to noise, for faster switching, reduced circuit delay and ultimately, faster operating speed.

Presently, greater utilization of noise analysis in the design phase of integrated circuits is required due to the reduced noise margin and increased noise susceptibility. When an integrated circuit is in the design phase, the emphasis of noise failure analysis can be more urgent than the problem of timing failure analysis. For most circuits, timing failure can be recovered by changing the clock speed to allow more time for a signal to propagate. However, noise is caused by many uncontrollable variables such as capacitive coupling and input slope. These variables are much more difficult to control after an integrated circuit is in production. For example, changing the capacitive coupling within an integrated circuit, generally, requires rewiring the integrated circuit to change the location of wires on the chip. If a noise problem goes undetected to the fabrication stage, correcting the noise problem will require an expensive second fabrication run.

Various transient analysis techniques can be utilized to estimate noise interference. Circuit or timing simulation techniques, such as SPICE, can be utilized to calculate noise levels. Modelling electrical characteristics such as coupling capacitance yields acceptable answers if a designer has adequate computational power, available time to detail the input, and additional time to wait for a solution. Circuit simulation methods are no longer sufficient to analyze noise, particularly in dynamic logic families.

A linear circuit model provides an accurate estimation for most coupled noise problems. To create a linear model, specialized linear model reduction techniques are utilized. Transient analysis in dynamic logic families through numerical integration or moment matching methods require considerable computational complexity and unacceptably long computation time. Model reduction requires repeated matrix factorizations, solutions to eigenvalues and solutions to time exponential evaluations. Generally, model order reduction yields a complete transient response of noise waveforms, but the computational cost of model order reduction is overburdening. Model reduction reduces the computational cost compared to complete numerical integration, but given the enormous complexity of today's interconnects, the required computation time is still unacceptable to most integrated circuit designers.

Utilizing modern moment matching methods can require more than a day to determine noise levels in a modern microprocessor circuit. The inefficiencies are even greater if noise analysis is to be utilized within layout design systems which calculate placement and routing.

Currently, most layout design systems utilize a geometric model for noise analysis. Geometric model systems are based on geometric distance between two wires. However, these simple formulas are not based upon theoretical electrical principles and hence, do not provide the required accuracy. Geometric models calculate interference merely from spatial arrangements.

Currently noise analysis and noise avoidance techniques are either inaccurate or inefficient, especially for dynamic logic families. Accurate moment matching methods or circuit simulation techniques are inefficient for both noise verification and noise avoidance. Hence, a more efficient electrical measurement system for noise analysis is needed to address current technological requirements.

There is a need for an efficient and accurate measuring system for estimating the coupled noise for on-chip interconnects. Additionally, there is a need for a system which can analyze noise for all circuit topologies within an acceptable time frame.

SUMMARY OF THE INVENTION

It is therefore one object of the present invention to provide a system and method for efficiently and accurately estimating induced noise in an integrated circuit.

It is another object of the present invention to provide a system and method which can analyze multiple circuit topologies for potential noise failures in an integrated circuit.

It is yet another object of the present invention to provide an integrated circuit noise measuring and analysis system for determining the maximum possible noise which might be induced into a susceptible circuit.

The foregoing objects are achieved as is now described. An efficient method for identifying potential noise failures in an integrated circuit design is provided by predicting peak noise within a victim circuit of an integrated circuit. Initially, a victim circuit within an integrated circuit is located. An aggressor circuit within the integrated circuit is located which has a specified physical relationship with the victim circuit, normally proximity. The slope of a signal within the aggressor circuit is analyzed and the coupling currents induced in the victim circuit by the aggressor circuit are computed. The input slope of the aggressor circuit and the physical relationship between the victim circuit and the aggressor circuit are utilized to determine a peak current induced into the victim circuit utilizing modelled coupling capacitance. The peak current and the equivalent impedance of the victim circuit can then be utilized to determine peak noise. Noise failures on integrated circuits can be avoided by detecting peak noise which is above acceptable levels.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF ILLUSTRATIVE EMBODIMENT

Figure 1:
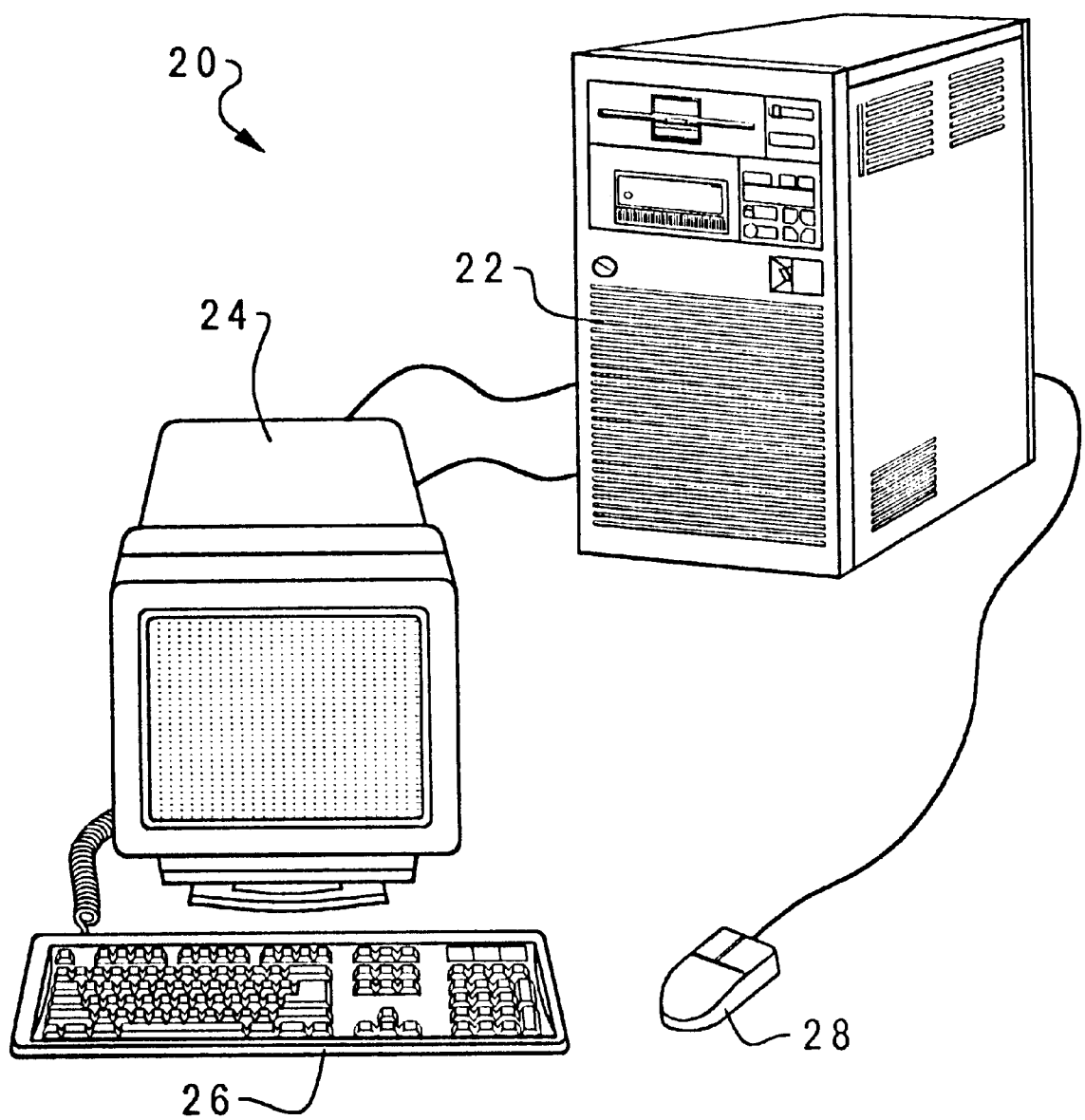
FIG. 1 illustrates a pictorial representation of a computer system which may be utilized to implement a preferred embodiment of the present invention.

With reference now to the figures and in particular with reference to FIG. 1, there is depicted a pictorial representation of a computer system which may be utilized to implement a preferred embodiment of the present invention. A computer system 20 is depicted that includes a system unit 22, a display device 24, a keyboard 26, and a mouse 28.

System unit 22 can be implemented utilizing any suitable hardware. In a preferred embodiment, the present invention is implemented on a computer which utilizes the AIX operating system. A computer such as the IBM-RS6000/390, a product of International Business Machines Corporation, located in Armonk, N.Y., is well suited for implementation of the present invention. However, those skilled in the art will appreciate that a preferred embodiment of the present invention can apply to any computer system, regardless of whether computer system 20 is a conventional personal computer system or a AIX based multi-user computing apparatus.

Figure 2:
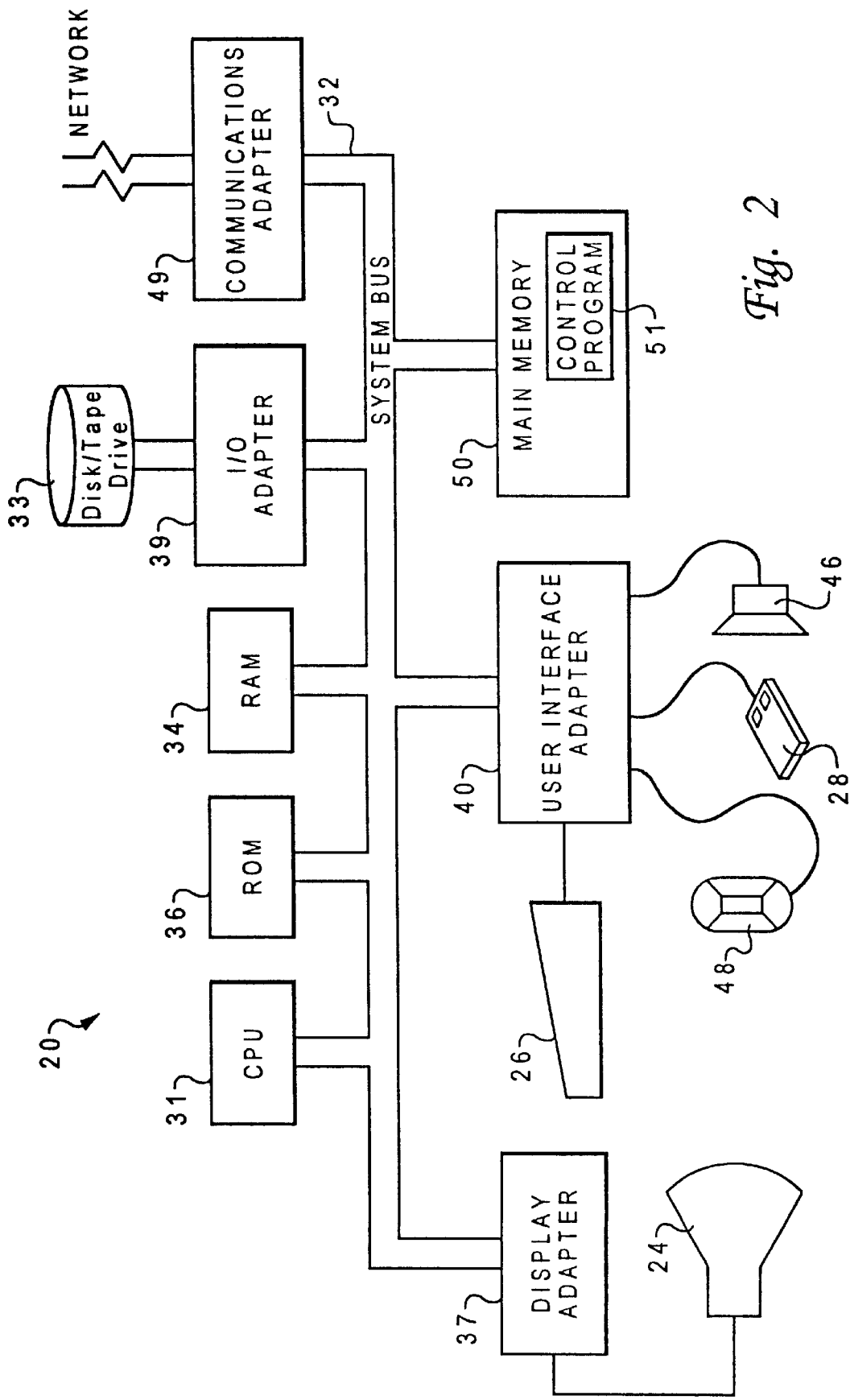
FIG. 2 depicts a hardware environment of the computer system illustrated in FIG. 1, in accordance with the present invention.

In FIG. 1 and FIG. 2, like parts are identified by like numbers. Computer system 20 is thus a configuration that includes all functional components of a computer and its associated hardware. In general, a typical computer system includes a console or system unit such as system unit 22, having one or more disk drives, a monitor such as video display terminal 24, and a keyboard such as keyboard 26. Of course, system unit 22 can be coupled to additional hardware, often referred to in the art as peripheral devices, including printers, modems, and joysticks.

FIG. 2 depicts a more detailed block diagram representation of an illustrative embodiment of the hardware of computer system 20 illustrated in FIG. 1. Computer system 20 includes a Central Processing Unit ("CPU") 31, such as a conventional microprocessor, and a number of other components interconnected via system bus 32. CPU 31 controls the operation of the entire computer system, including the execution of the arithmetic and logical functions contained in an operating system and other software. Although not depicted in FIG. 2, CPUs such as CPU 31 typically include a control unit that organizes data and program storage in a computer memory and transfers data and other information between the various parts of system unit 22. CPUs generally include an arithmetic unit that executes the arithmetical and logical operations, such as addition, comparison, multiplications and so forth.

Computer system 20 further includes random-access memory (RAM) 34, read-only memory (ROM) 36, a display adapter 37 for connecting system bus 32 to video display device 24, and are I/O adapter 39 for connecting peripheral devices (e.g., disks and tape drive 33) to system bus 32.

Video display device 24 displays the visual output of computer system 20. Video display terminal 24 can be a cathode-ray tube (CRT) as is well-known in the computer arts. However, with a portable or notebook-based computer, video display terminal 24 can be replaced with a liquid crystal display (LCD) or gas plasma flat-panel display. Computer system 20 further includes user interface adapter 40 for connecting keyboard 26, mouse 28, speaker 46, microphone 48, and/or other user interface devices, such as a touch-screen device (not shown), to system bus 32. Communications adapter 49 connects computer system 20 to a computer network. Although computer system 20 is depicted to contain only a single CPU and a single system bus, it should be understood that the present invention applies equally to computer systems that have multiple CPUs, and to computer systems that have multiple buses.

Computer system 20 also includes an operating system that resides within a machine-readable media to direct the operation of computer system 20. Any suitable machine-readable media may retain the operating system, such as RAM 34, ROM 36, a magnetic diskette, magnetic tape, or optical disk (the last three can be located in disk and tape drives 33). Any suitable operating system and associated interface (e.g., Microsoft Windows or AIX) may direct CPU 31. Other technologies such as touch-screen technology or human voice control can also be utilized in conjunction with CPU 31. For example, the AIX operating system and AIX-windows windowing system can direct CPU 31. The AIX operating system is IBM's implementation of the UNIX operating system.

Those skilled in the art will appreciate that the hardware depicted in FIG. 2 may vary for specific applications. For example, other peripheral devices such as optical disk media, audio adapters, or chip programming devices, such as PAL or EPROM programming devices well-known in the art of computer hardware and the like, may be utilized in addition to or in place of the hardware already depicted. In addition, main memory 50 is connected to system bus 32, and includes a control program 51. Control program 51 normally will reside within main memory 50, and contain instructions that, when executed on CPU 31, carries out the operations depicted in the flow diagram of FIG. 3. The computer program product also can be referred to as a program product. Control program 51 contains instructions that when executed on CPU 31 can carry out logical operations such as those operations depicted in the logic flow charts of FIG. 3.

It is important to note that, while the present invention has been, and will continue to be described in the context of a fully functional computer system, those skilled in the art will appreciate that the present invention is capable of being distributed as a program product in a variety of forms, and that the present invention applies equally regardless of the particular type of signal-bearing media utilized to actually carry out the distribution. Examples of signal-bearing media include: recordable-type media, such as floppy disks, hard disk drives, and CD ROMs, and transmission-type media such as digital and analog communication links. A modem is an example of a communication devices that enables computers such as computer 20 to transmit information over a transmission type media.

Referring to the method of the present invention, the method is especially useful for noise critical pruning and physical design based noise avoidance techniques such as placement, routing, sizing, and buffering. Noise critical pruning is defined as classifying circuits which exhibit a specified level of susceptibility for pruning or further consideration.

The present invention determines the maximum noise which might be induced on a net by a switching net. Additionally, the present invention can determine the maximum noise induced in a set of nets by a set of switching nets.

The present invention is effective for providing an upper bound on the coupled noise for resistive-capacitive and over-damped resistive-inductive-capacitive circuits. Coupled noise in an interconnected network is caused by capacitive coupling between an active, or aggressor net or aggressor node and a passive victim net or victim node.

Figure 3:
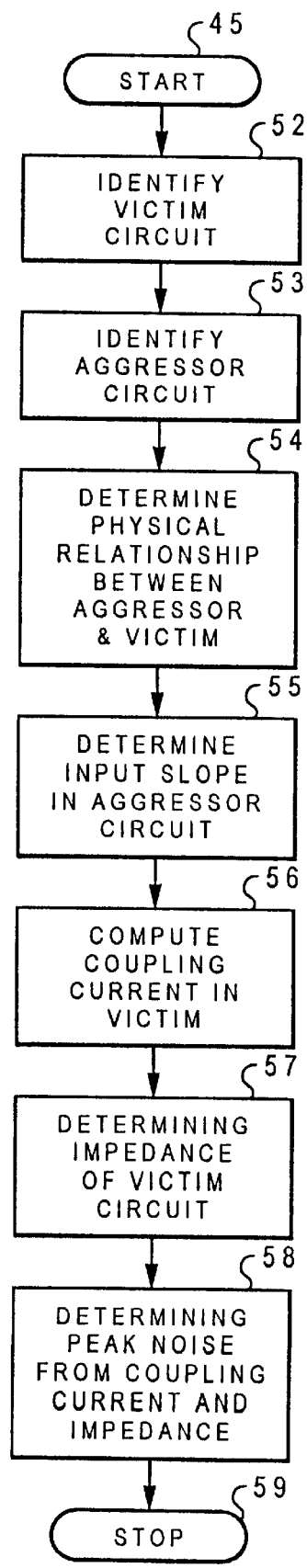
FIG. 3 depicts a flow diagram that illustrates basic steps utilized to carry out the method of the present invention.

Referring now to FIG. 3, there is depicted a high level logic flowchart of a method, in accordance with the present invention to efficiently determine potential noise interference within an integrated circuit. In a preferred embodiment, the method is utilized during the design stage of an integrated circuit. However, the method could be utilized to locate noise which manifests in production. The method of the present invention can be implemented by the computer system depicted in FIGS. 1 and 2.

As depicted in FIG. 3, the process starts at block 45 and thereafter proceeds to block 52. As depicted in block 52, the present invention identifies all of the victim circuits or circuits which may be subjected to noise on an integrated circuit. The phrase, "victim circuit" and "victim net", are intended to be synonymous in this application. As a result of capacitive coupling, a victim circuit will receive an unwanted current from an aggressor circuit. Next, as illustrated in block 53, an aggressor circuit is identified. Generally, since coupling capacitance is a function of the distance which separates two circuits, the aggressor circuit is likely to be in close proximity to the victim circuit.

Thereafter, as shown in block 54, the physical relationship (i.e., distance) between the aggressor circuit and victim circuit is identified to determine the coupling phenomena. Coupling capacitance generally is determined by utilizing the dielectric properties of the material between two wires, the adjacent parallel area of the wires, and the distance which separate the wires. In block 55, the input slope of the signal which drives the aggressor circuit is determined by calculating the supply voltage divided by the rise time. This, generally, provides an accurate estimation because the input slope is essentially uniform throughout the aggressor circuit.

Utilizing the slope of the signal within the aggressor circuit and the physical relationship between the aggressor circuit and the victim circuit, the current induced within the victim circuit is then calculated, as illustrated in block 56.

Next, as depicted in block 57, the impedance of the victim circuit is calculated. As shown in block 58, the peak voltage or noise induced in the victim circuit by the aggressor circuit can be calculated utilizing the induced current and the impedance of the victim circuit. Thereafter, the method terminates, as illustrated at block 59.

Figure 4:
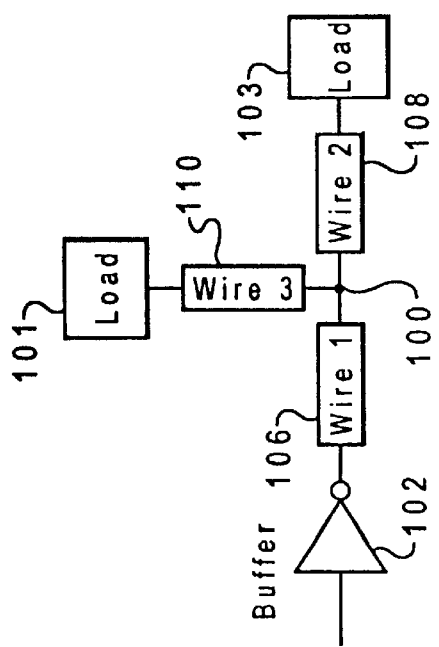
FIG. 4 depicts a typical victim circuit which can be effectively analyzed by the present invention.

FIG. 4 depicts a circuit which will aid in illustrating an embodiment of the present invention. Individual wires of the circuit in FIG. 4, are modelled by their equivalent resistance and equivalent capacitance in FIG. 5. An equivalent electrical model of the wires interconnecting the identified node may require accessing a database which stores the physical data of the circuit elements. The present method can save time utilizing known input variables, such as previously calculated coupling capacitance.

After retrieving the electrical characteristics of the wires at a node, data such as the distance between adjacent traces and the corresponding capacitive coupling on all sides of the nodes are utilized to build a circuit equation. An alternate embodiment can calculate the equivalent electrical characteristics by querying the user about pertinent data such as the material utilized for wires, cross-sectional area of the wires, and separation distances between wires. Different interconnect technologies utilize different wire dimensions and wire spacing. Consequently, each technology produces distinct variables, parameters and circuit configurations.

Retrieving as much circuit data as possible from memory 50 of computer system 20 of FIG. 2 allows the circuit equation to be built more efficiently. Many physical design systems will contain precalculated coupling capacitance between nets, in the integrated circuit design data. When computer system 20 has to query the operator for material type and trace dimensions, system efficiency is degraded. Accurate identification of the variables and parameters which provide the circuit characteristics is critical to an accurate calculation from the noise model.

Figure 5:
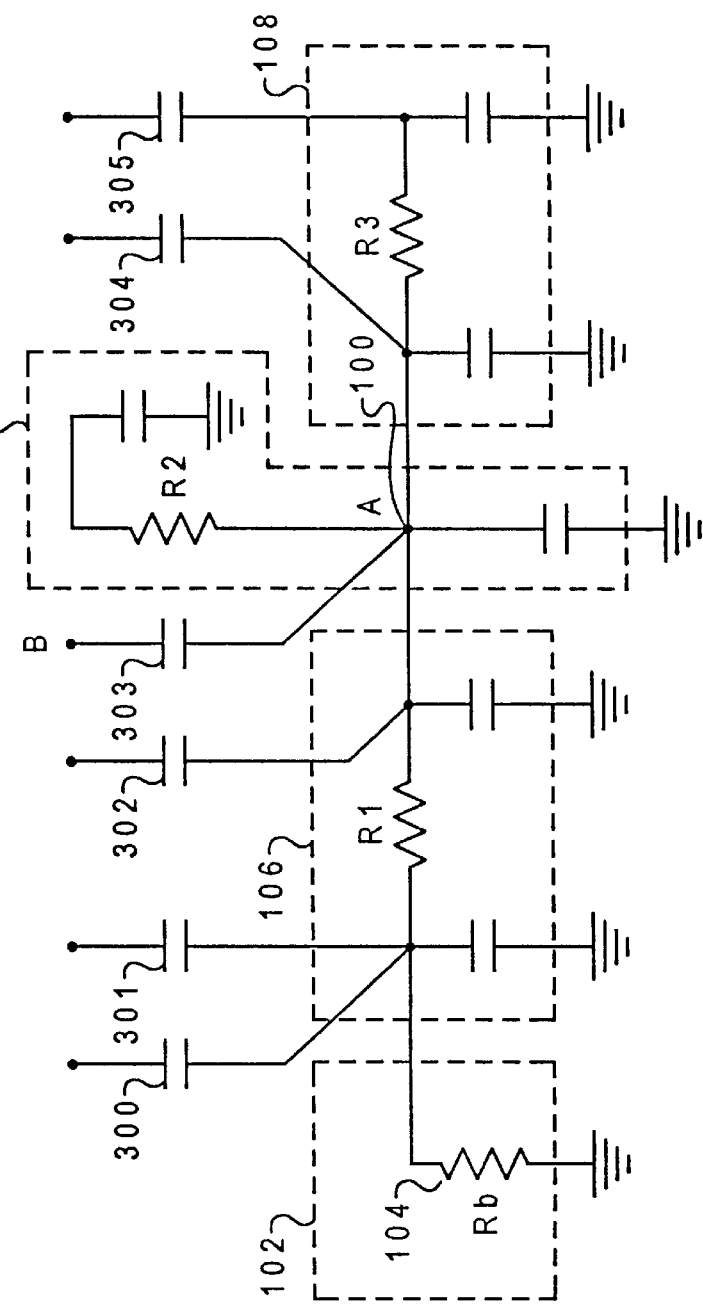
FIG. 5 depicts an equivalent circuit model of the circuit in FIG. 4, in accordance with the present invention.

Referring to the circuit of FIG. 4, a typical victim circuit is depicted. Net or node 100 is supplied logic signals by buffer 102. Node 100 provides a branch to supply the logic signal of buffer 102 to two different loads 101 and 103. Referring to FIG. 5, the equivalent electrical characteristics of the circuit of FIG. 4 are depicted. In FIG. 4 and FIG. 5, like parts are identified by like numbers. Wire 1 106 of FIG. 4 is modelled by dashed enclosure 106 of FIG. 5. Likewise, wire 2 108 is modelled by dashed enclosure 108 and wire 3 110 is modelled by dashed enclosure 110. $R_b$ 104 is the equivalent resistance of buffer 102. For basic noise coupling calculations, the aggressor net is the net that switches states. The victim net is quiescent and tries to maintain its present state. Capacitors 300, 301, 302, 303, 304 and 305 model the capacitive coupling which induces current into the victim circuit via the aggressor circuit (not shown).

FIG. 5 represents a general circuit model influenced by coupled noise; however, the aggressor circuit and victim circuit can have many different topologies. In a preferred embodiment, the coupling between the victim circuit and the aggressor circuit is represented by a linear circuit description.

In general, the number of victim nets and the number of aggressor nets may be more than one. For simplification one victim circuit and one aggressor circuit are initially analyzed. This basic understanding can be easily extended to multiple victim circuits and multiple aggressor circuits.

Figure 6:
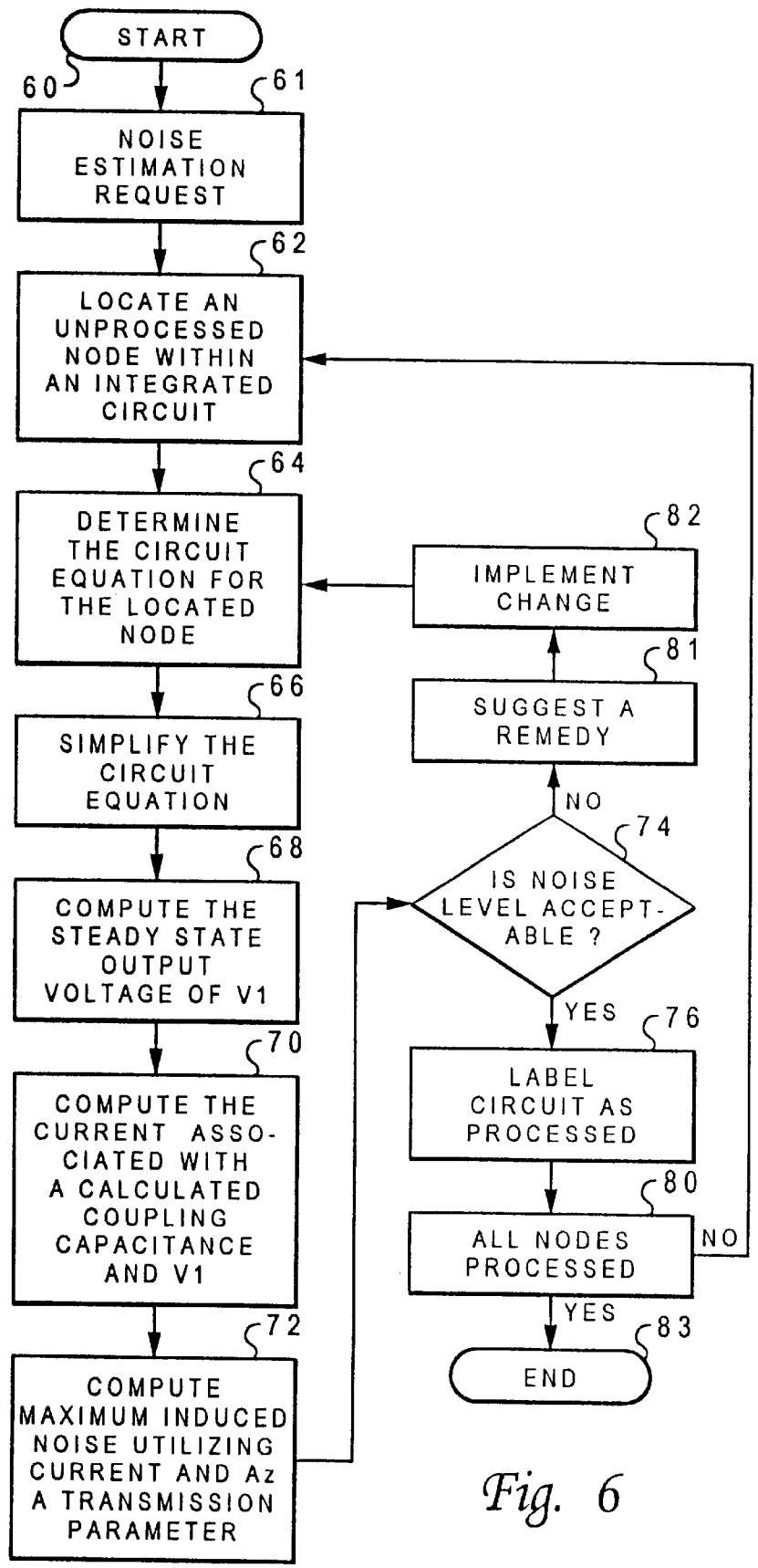
FIG. 6 illustrates a more detailed flow diagram in accordance with the present invention.

Utilizing the circuit model discussed above, the method of the present invention can be more thoroughly understood. Referring now to FIG. 6, a more detailed flow diagram in accordance with the present invention is depicted. As illustrated, the process begins at block 60. The process thereafter proceeds to block 61 where the system input and output "I/O" alerts the operating system to start the noise estimation method of the present invention. The request may come from the human operator of computer system 20 in FIG. 1, or it may come from an automated request from a software routine which has created or modified the routing of wires on an integrated circuit.

In a preferred embodiment, after the completion of an integrated circuit design, the method of the present invention sequentially searches and locates circuits within the integrated circuit to find an unprocessed node, as depicted in block 62.

In a preferred embodiment, only nodes which are driven by buffers are identified and then processed by the method of the present invention. In alternate embodiments, nodes or any other circuit structures can be identified for analysis. As depicted in block 64, after a node is identified, a circuit equation in matrix form is created utilizing electrical characteristics such as the input slope of the input signal and the equivalent resistance and capacitance of the wires interconnecting the node.

In accordance with block 64, and referring back to FIG. 4 and FIG. 5, the matrix equation of the circuit depicted in FIG. 4 and FIG. 5 can be written as:

$$\begin{bmatrix} C_1 & C_c \\ C_c & C_2 \end{bmatrix}\begin{bmatrix} \dot{v}_1 \\ \dot{v}_2 \end{bmatrix} = \begin{bmatrix} A_{11} & A_{12} \\ A_{21} & A_{22} \end{bmatrix}\begin{bmatrix} v_1 \\ v_2 \end{bmatrix} + \begin{bmatrix} B_1 \\ B_2 \end{bmatrix} v_s \qquad \text{Eq. 1}$$

where:

subscript 1 denotes an aggressor related variable subscript 2 denotes a victim related variable $v_1$ is a vector of node voltages in the aggressor net $v_2$ is a vector of node voltages in the victim net $v_s$ is the input to the aggressor net $C_c$ is the coupling capacitance between the aggressor net and the victim net; and A's represent the impedance between the corresponding subscripts.

In the Laplace domain, Eq. 1 becomes $$sC_1V_1 + sC_cV_2 = A_{11}V_1 + A_{12}V_2 + B_1V_s \qquad \text{Eq. 2}$$

which can be rewritten as $$V_1 = (sC_1 - A_{11})^{-1}[(A_{12} - sC_c)V_2 + B_1V_s] \qquad \text{Eq. 3}$$

Solving for the coupled noise waveform $V_2$, $$sC_cV_1 + sC_2V_2 = A_{21}V_1 + A_{22}V_2 + B_2V_s \qquad \text{Eq. 4}$$

or $$(sC_2 - A_{22})V_2 = (A_{21} - sC_c)(sC_1 - A_{11})^{-1}[(A_{12} - sC_c)V_2 + B_1V_s] + B_2V_s$$

Alternatively, $$[(sC_2 - A_{22}) - (A_{21} - sC_c)(sC_1 - A_{11})^{-1}(A_{12} - sC_c)]V_2 = (A_{21} - sC_c)(sC_1 - A_{11})^{-1}B_1V_s + B_2V_s \qquad \text{Eq. 5}$$

To simplify the circuit equation in accordance with block 66 of FIG. 6, interconnected networks resulting coupled noise have special characteristics. Substitution for certain variables allow simplification without appreciable loss of accuracy.

$A_{12}$ is set to zero in Equation 5 because there is no DC path or resistive path between the aggressor net and the victim net. A non-zero value of $A_{12}$ would indicate a resistive or DC path from the aggressor net to the victim net. If $A_{12} \neq 0$, by definition, the aggressor net and victim net would electrically be the same net. Hence, $A_{12}$ can be assumed to be zero for the present invention.

Likewise, $A_{21}$ is set to zero in Equation 5 because there is no DC path or resistive path between the victim net and the aggressor net. A non-zero value of $A_{21}$ would indicate a resistive or DC path from the victim net to the aggressor net. Hence, $A_{21}$ can be assumed to be zero for the present invention.

Further, $B_2$ is set to zero in Equation 5 because no resistive or DC path exists from the source, $V_s$, to both the victim net and the aggressor net. A voltage source is not directly exciting the victim net, and if $B_2 \neq 0$ coupled noise would be meaningless. Hence, $B_2$ can be assumed to be zero for the present invention.

Given these assumptions, the circuit equation for the coupled noise in the circuit of FIG. 4 can be rewritten as $$\begin{bmatrix} C_1 & C_c \\ C_c & C_2 \end{bmatrix} \begin{bmatrix} \dot{v}_1 \\ \dot{v}_2 \end{bmatrix} = \begin{bmatrix} A_{11} & 0 \\ 0 & A_{22} \end{bmatrix} \begin{bmatrix} v_1 \\ v_2 \end{bmatrix} + \begin{bmatrix} B_1 \\ 0 \end{bmatrix} v_s \qquad \text{Eq. 6}$$

Equation 6 can further be simplified to $$[(sC_2 - A_{22}) - sC_c(sC_1 - A_{11})^{-1}sC_c]V_2 = -sC_c(sC_1 - A_{11})^{-1}B_1 V_s \qquad \text{Eq. 7}$$

Next, in accordance with block 68 of FIG. 6, the steady state output voltage of the aggressor circuit is determined. Let, $$H(s) = \frac{V_2(S)}{V_s(S)} \qquad \text{Eq. 8}$$

Assuming the coupling between the aggressor net and the victim net is purely capacitive, utilizing a final value theorem $\lim t \to \infty$ on Equation 8, a steady state output voltage of the aggressor circuit can be determined. H(S) has a zero at s=0 because the coupling between the aggressor net and victim net is assumed to be purely capacitive.

If the input to the aggressor circuit $V_s$ is an infinite ramp or has infinite slope, the output of the is aggressor circuit $V_1$ is also an infinite ramp. However, the output would be delayed by the propagation delay of the aggressor net. All nodes in the victim net exponentially charge-up to their respective finite maximum steady state values. The finite steady state value of the victim net is a function of the slope of the signal in the aggressor circuit. In reality, the input to the aggressor circuit $V_s$ is a finite ramp. Regardless of whether the input to the aggressor circuit is a finite ramp or an infinite ramp, the derivative of the coupled noise $V_2$ is zero at $t=\infty$ and the coupled noise $V_2$ has a finite maximum value.

In accordance with block 68, the present method computes the finite maximum value of coupled noise utilizing Equation 8 and the final value theorem where $V_2(s)$ at $t=\infty$. The final value theorem is provided below.

$$V_{2,max} = \lim_{s \to 0} sV_2(s) \qquad \text{Eq. 9}$$

$$V_{2,max} = \lim_{s \to 0} sH(s)u(s) = \lim_{s \to 0} sH(s)\frac{u}{s^2} = \lim_{s \to 0} H(s)\frac{u}{s}$$

Combining Equation 9 with Equation 7 yields.

$$V_{2max} = -A_{22}^{-1} C_c A_{11}^{-1} B_1 \dot{u} \qquad \text{Eq. 10}$$

Equation 10 provides the maximum amount of coupled noise induced by the aggressor into the victim net $V_2$ in a single cycle. Equation 10 yields an upper bound because due to the monotonicity of the resistive-capacitive circuit response. The monotonicity is still maintained even in the presence of inductors, which might over-damp or critically damp the circuit of FIG. 5.

The maximum coupled noise given by Equation 10 is easy to evaluate for an average computer system. Assumptions of basic circuit conditions will further simplify the computation.

By definition $$\dot{V}_{1,ss} = -A^{-1}_{11} B_1 \dot{u} \qquad \text{Eq. 11}$$

So Equation 10 can be rewritten as $$V_{2,max} = A^{-1}_{22} C_c \dot{V}_{1ss} \qquad \text{Eq. 12}$$

and utilizing Equation 12

$$I_c = C_c \dot{V}_{1ss} \qquad \text{Eq. 13}$$

Equation 10 can then be rewritten as $$V_{2,max} = A^{-1}_{22} I_c \qquad \text{Eq. 14}$$

Summarizing, as depicted in block 68, the steady state voltage of $V_1$ can be computed utilizing $A_{11} B_1$ and $\dot{u}$.

Analyzing the aggressor net requires the computation of $\dot{V}_{1,ss} = -A^{-1}_{11} B_1 \dot{u}$. To compute $\dot{V}_{1ss}$, the input source is replaced by a voltage source which has been of value to the derivative of the input $V_s$. In accordance with the final value theorem, all the capacitors in the aggressor net are replaced by open circuits and all coupling capacitors to the victim net are also replaced by open circuits.

The solution to the circuit equation provides a steady state ramp derivative $\dot{V}_{1,ss}$, at each corresponding node. The solution of this circuit involves the matrix factorization of the aggressor net's dissipative matrix. However, for typical interconnects, this solution requires trivial computational effort.

A dissipative path to ground in the interconnect would mean DC loss of signal. In a typical case of no dissipative path to ground, computation of $\dot{V}_{1,ss}$ is trivial. In such a case, there is substantially no current flow to ground, and $\dot{V}_{1ss} = \dot{V}_s$. In summary $\dot{V}_{1,ss} = \dot{V}_s$, where there is no resistive path to ground in the aggressor net. Computation of the coupling current is easily performed utilizing $I_c = C_c \dot{V}_{1,ss}$. As illustrated, calculating the coupling current is accomplished by a simple multiplication step.

Then as depicted in block 72 of FIG. 6, the victim net is analyzed by computing $V_{2,max} = A^{-1}_{22} I_c$. In accordance with block 72, a simple multiplication step can be performed to convert the steady state derivative of the aggressor net emission to a current on the victim net. This is accomplished by utilizing the coupling capacitor matrix, $C_c$ and $\dot{V}_{1ss} = \dot{V}_s$ to determine each individual current. $I_c$ is the summation of the circuits on the victim net attained as follows:

$$I_i = \sum_{\forall j} C_{c,ij} \dot{V}_{1j,ss} \qquad \text{Eq. 15}$$

where $C_{c,ij}$ is the coupling capacitance between victim nodes and aggressor nodes. Equation 15 indicates the summation of all nodes in the aggressor net currents or set of aggressor net currents which are capacitively coupled. For example, referring to FIG. 5, the summation of the currents which effect node A 100 on the victim net are modelled in FIG. 6 by the current through capacitors 300, 301, 302, 303, 304 and 305.

Next, as depicted in block 72 of FIG. 6, a computation of the maximum induced noise on the victim net is made. The capacitors in the victim net of FIG. 6 are replaced by the equivalent currents $I_{c1}$, $I_{c2}$ and $I_{c3}$ as in FIG. 7. The equivalent currents are currents which flow through modelled coupling capacitors 300–305.

Figure 7:
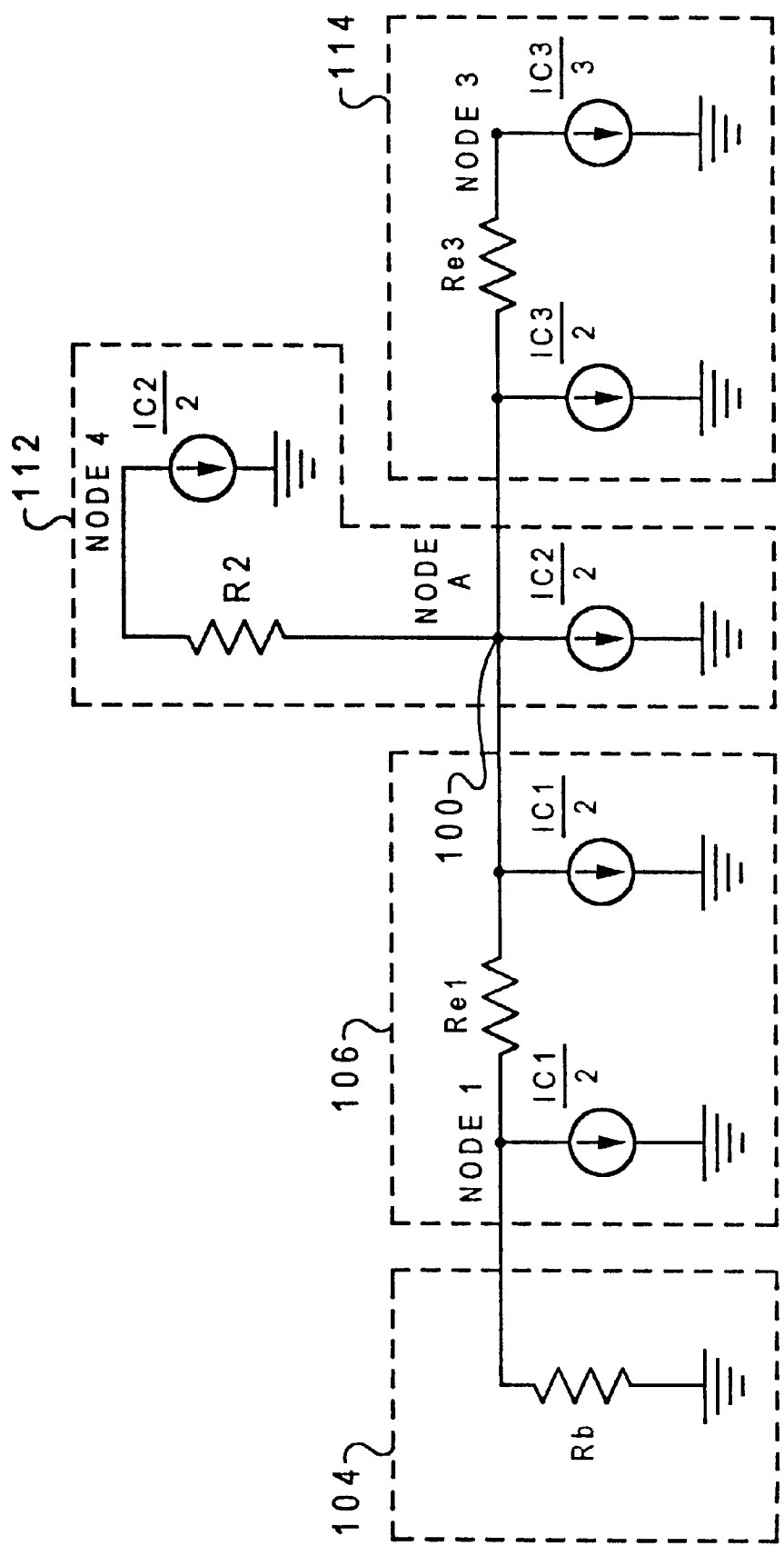
FIG. 7 depicts the basic capacitive coupling model and how aggressor circuits induce current into the circuit model of a victim circuit, in accordance with the present invention.

Utilizing the current through each individual capacitor as calculated in block 70 of FIG. 6, the sum of all currents at each individual node such as node A 100 of FIG. 7 is performed. $I_c$ is a vector quantity. Coupling capacitor currents in the victim net are replaced by current sources having values which corresponds to the index in the $I_c$ vector corresponding to each net as depicted in FIG. 7. The voltage in the victim circuit which results in the flow of capacitive current on a node gives the maximum noise that might be coupled at that node. The total induced voltage at node 100 multiplied by the impedance of node 100 provides the maximum noise that will be induced at node 100. The computation of the maximum induced noise requires a DC solution of the equation of the victim net as illustrated in block 72. The computation of the DC solution is a single matrix factorization requiring minimal computational cost.

As mentioned above, the solution of the maximum induced noise in a node requires a DC solution of the victim net. The computational cost of the induced noise and the computational cost of a DC solution of the aggressor net is required in order to determine the steady state derivative and coupling currents at a node. However, as mentioned earlier, for typical interconnects, the solution of an aggressor net is trivial and does not require significant computational cost. Similarly, for typical interconnects, the solution of the victim net is also greatly simplified and requires only a linear time evaluation. Linear time evaluation can be carried out efficiently by most modern computers.

As mentioned earlier the maximum induced noise at each node can be written from simple circuit analysis by summing the currents at each node.

In general, for a tree structure, the maximum induced noise, $N_{max,i}$, at node A can be computed as $$N_{max,i} = R_i \sum_{\forall l} I_j + N_{max,i-1} \qquad \text{Eq. 16}$$

where $\forall l$ denotes the summation of all coupling currents at a node which are in the direction of a current sink of a victim net and $N_{max,i-1}$ denotes the noise at the previous node towards the root of a tree or alternatively towards the source of the signal, such as the output of buffer 102 in FIG. 5.

The present invention can be utilized to compute the maximum allowable coupling capacitance given a predetermined noise allowance because the estimation is in a closed form expression. Given predetermined noise allowance, a minimum distance between nets, nodes or wires can be computed for a specific design.

Computing the maximum coupled noise or the voltage component of the noise, requires multiplication of coupling currents and impedances or resistance at the node as illustrated in Equation 18. The complexity of this computation is significantly lower than either transient analysis utilizing numerical integration or moment matching methods.

As illustrated by block 74, after the calculations of the present invention provide a maximum noise solution, the user can be queried as to whether the computed noise is within an acceptable level.

Referring to block 81, in a preferred embodiment, a threshold noise level can be set by the user and when a noise estimation is computed which is above this predetermined threshold level, a remedy can be suggested by the design system to the user.

As illustrated in block 82, if a change is implemented then block 64 will implement the changes into a new circuit equation.

As illustrated in block 76, if the noise level of the analyzed victim net is acceptable, the present invention will label the newly processed net as processed. As depicted by block 80, if all nodes are not processed the present invention will again search for an unprocessed node. If all nodes have been processed, the present invention turns control over to the layout design system which is utilizing the present invention or proceed to end block 83.

In block 82 a fix or remedy can be incorporated by a user without the suggestion of the computer system. The change or remedy in block 82 may be as simple as physically moving a wire a short distance from an adjacent wire.

In the case of multiple aggressor nets, linear superposition can be utilized to determine a noise solution. Coupling current or $I_c$ from Equation 18 can then be computed for each aggressor net by multiplying the respective capacitive coupling by the respective input slope for each aggressor net. Coupling currents from each aggressor net are added together to compute the total current in a victim net. Then, the total current can be utilized to compute the theoretical maximum induced noise produced by the voltage which results from the induced current.

In case of timing orthogonality, the summation of currents from the aggressor nets must be performed differently. Timing orthogonality implies different arrival times of signals on different aggressor nets. Generally arrival times are described by a time window. A time window is a block of time which the signal is expected to arrive, for example, 5 to 7 nano seconds after a defined clock pulse. For orthogonal timed cases, only the aggressor nets with overlapping arrival time windows are considered in computing the maximum noise on the victim nets because maximum noise usually occurs during the time window overlaps.

The techniques described herein have been implemented in a noise computation tool. Noise accuracy and computation speed results on various interconnect structures have been preformed.

The peak coupled noise on a victim net for a typical small resistive-capacitive interconnect structure having an aggressor net driven by a signal having a rise time of 200 ps and a power supply voltage of 1.8 v has been analyzed. Utilizing a circuit simulation routine and the present invention in parallel, the present invention and circuit simulation yield substantially equivalent results, while the present invention provides much faster evaluation time.

The accuracy of the present invention degrades with reduction in rise times of the signal of the aggressor net because coupling capacitance is no longer the predominant factor. However, the present invention always predicts a higher value for peak noise than the actual peak noise value obtained by conventional circuit simulation. If the rise time is fast, the victim circuit does not charge to as high of level as assumed by the present invention. Hence, the present invention predicts a value of the peak noise which is greater than the actual peak noise.

The accuracy of the present invention is acceptable for most noise verification, noise pruning and physical design applications. The present invention is substantially faster than any prior solution for noise analysis. For example, a noise characteristic computation for a 50,000 element circuit utilizing a moment matching model takes 145 seconds to complete utilizing conventional circuit simulation, while the present invention provides substantially the same results in 3.44 seconds.

While the invention has been particularly shown and described with reference to a preferred embodiment, it will be understood by those skilled in the art that various changes in form and detail may be made therein without departing from the spirit and scope of the invention.

What is claimed is:

1. An efficient method for identifying potential noise failures in an integrated circuit design by predicting peak noise within a victim circuit, said method comprising:

locating a victim circuit within an integrated circuit, said victim circuit having an impedance;

locating an aggressor circuit within said integrated circuit, said aggressor circuit having a specified physical relationship with said victim circuit;

determining a slope of a signal within said aggressor circuit;

computing a coupling current induced in said victim circuit by said aggressor circuit utilizing said input slope and said specified physical relationship between said victim circuit and said aggressor circuit wherein said computing step utilizes a sum of products based on electrical characteristics of said victim circuit and said aggressor circuit; and determining a peak noise induced in said victim circuit utilizing said coupling current and said impedance of said victim circuit, said peak noise being an upper bound on noise, and wherein noise failures can be avoided by detecting a peak noise which is above acceptable levels.

2. The method of claim 1, wherein said determining step determines said slope of said signal by supply voltage divided by a rise time of said signal.

3. The method of claim 1, wherein said locating steps include the step of locating said victim circuit and said aggressor circuit having no DC paths to ground.

4. The method of claim 1, wherein said computing step computes a coupling current which is comprised of a plurality of currents.

5. The method of claim 1, wherein said computing step utilizes a vector current as the coupling current.

6. The method of claim 1, wherein said determining step determines a peak noise which is a voltage.

7. The method of claim 4, wherein said victim circuit has a plurality of nodes, and wherein a plurality of coupling currents are summed at each of said plurality of nodes of said victim circuit wherein further, said determining step allows for incremental addition of circuit components with corresponding coupling currents.

8. A system for identifying potential noise failures in an integrated circuit design by predicting peak noise within a victim circuit, said system comprising:

means for locating a victim circuit within an integrated circuit, said victim circuit having an impedance;

means for locating an aggressor circuit within said integrated circuit, said aggressor circuit having a specified physical relationship with said victim circuit;

means for determining a slope of a signal within said aggressor circuit;

means for computing a coupling current induced in said victim circuit by said aggressor circuit utilizing said input slope and said specified physical relationship between said victim circuit and said aggressor circuit wherein said computing step utilizes a sum of products based on electrical characteristics of said victim circuit and said aggressor circuit; and means for determining a peak noise induced in said victim circuit utilizing said coupling current and said impedance of said victim circuit, said peak noise being an upper bound on noise, and wherein noise failures can be avoided by detecting a peak noise which is above acceptable levels.

9. The system of claim 8, wherein said determining means determines said slope of said signal by supply voltage divided by a rise time of said signal.

10. The system of claim 8, wherein said locating means include the means for locating said victim circuit and said aggressor circuit having no DC paths to ground.

11. The system of claim 8, wherein said computing means computes a coupling current which is comprised of a plurality of currents.

12. The system of claim 8, wherein said computing means utilizes a vector current as the coupling current.

13. The system of claim 8, wherein said determining means determines a peak noise which is a voltage.

14. The system of claim 11, wherein said victim circuit has a plurality of nodes, and wherein a plurality of coupling currents are summed at each of said plurality of nodes of said victim circuit to determine said peak noise.

15. A program product residing in computer memory in a computer system for identifying potential noise failures in an integrated circuit design by predicting peak noise within a victim circuit, said program product comprising:

instruction means residing in a computer system for locating a victim circuit within an integrated circuit, said victim circuit having an impedance;

instruction means residing in a computer system for locating an aggressor circuit within said integrated circuit, said aggressor circuit having a specified physical relationship with said victim circuit;

instruction means residing in a computer system for determining a slope of a signal within said aggressor circuit;

instruction means residing in a computer system for computing a coupling current induced in said victim circuit by said aggressor circuit utilizing said input slope and said specified physical relationship between said victim circuit and said aggressor circuit wherein said computing step utilizes a sum of products based on electrical characteristics of said victim circuit and said aggressor circuit; and determining a peak noise induced in said victim circuit utilizing said coupling current and said impedance of said victim circuit, said peak noise being an upper bound on noise, and wherein noise failures can be avoided by detecting a peak noise which is above acceptable levels.

16. The program product of claim 15, wherein said determining step determines said slope of said signal by supply voltage divided by a rise time of said signal.

17. The program product of claim 15, wherein said computing step computes a coupling current which comprises a plurality of currents.

18. The program product of claim 15, wherein said instruction means are adapted to compute a coupling current which is a vector current.

19. The program product of claim 15, wherein said determining step determines a peak noise which is a voltage.

20. The program product of claim 17, wherein said victim has a plurality of nodes, and wherein a plurality of coupling currents are summed at each of said plurality of nodes of said victim circuit to determine said peak noise.

* * * * *